United States Patent
Ahmad et al.

(10) Patent No.: US 7,394,638 B2
(45) Date of Patent: Jul. 1, 2008

(54) SYSTEM AND METHOD FOR A WHOLE-CHIP ELECTROSTATIC DISCHARGE PROTECTION THAT IS INDEPENDENT OF RELATIVE SUPPLY RAIL VOLTAGES AND SUPPLY SEQUENCING

(75) Inventors: Adeel Ahmad, Lucknow (IN); Rajat Chauhan, Dehradun (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 481 days.

(21) Appl. No.: 11/022,306

(22) Filed: Dec. 24, 2004

(65) Prior Publication Data
US 2005/0162791 A1 Jul. 28, 2005

(30) Foreign Application Priority Data
Dec. 26, 2003 (IN) .................. 1617/DEL/2003

(51) Int. Cl.
*H02H 3/22* (2006.01)
(52) U.S. Cl. .................. 361/111; 361/56; 361/91.3
(58) Field of Classification Search .................. 361/56, 361/111
See application file for complete search history.

(56) References Cited

U.S. PATENT DOCUMENTS 5,532,626 A * 7/1996 Khayat .................. 327/53
5,886,862 A * 3/1999 Anderson et al. .......... 361/56
2004/0125521 A1* 7/2004 Salling et al. .............. 361/56

OTHER PUBLICATIONS

Ming-Dou Ker, Whole-Chip ESD Protection Design with Efficient VDD-to-VSS ESD Clamp Circuits for Submicron CMOS VLSI, Jan. 1999, IEEE, vol. 46, No. 1, pp. 173-183.*

* cited by examiner

Primary Examiner—Michael J Sherry
Assistant Examiner—Tien Mai

(57) ABSTRACT

The embodiments of the present invention introduced and taught herein are directed to a whole-chip ESD protection arrangement that is independent of relative supply rail voltage and supply sequencing, thereby enabling ESD conduction path during ESD event and isolating the ESD conduction path during the power up and power down modes of the chip. An embodiment of the present invention uses the bi-directional R-C clamp with transistorized arrangements between powered rails and avoids the drawback of using uni-directional Clamps or diode array for clamping that consumes large silicon area, requires power sequencing and is prone to noise coupling between power rails.

20 Claims, 9 Drawing Sheets

Symbol for Bi-directional RC-controlled ESD-Clamp

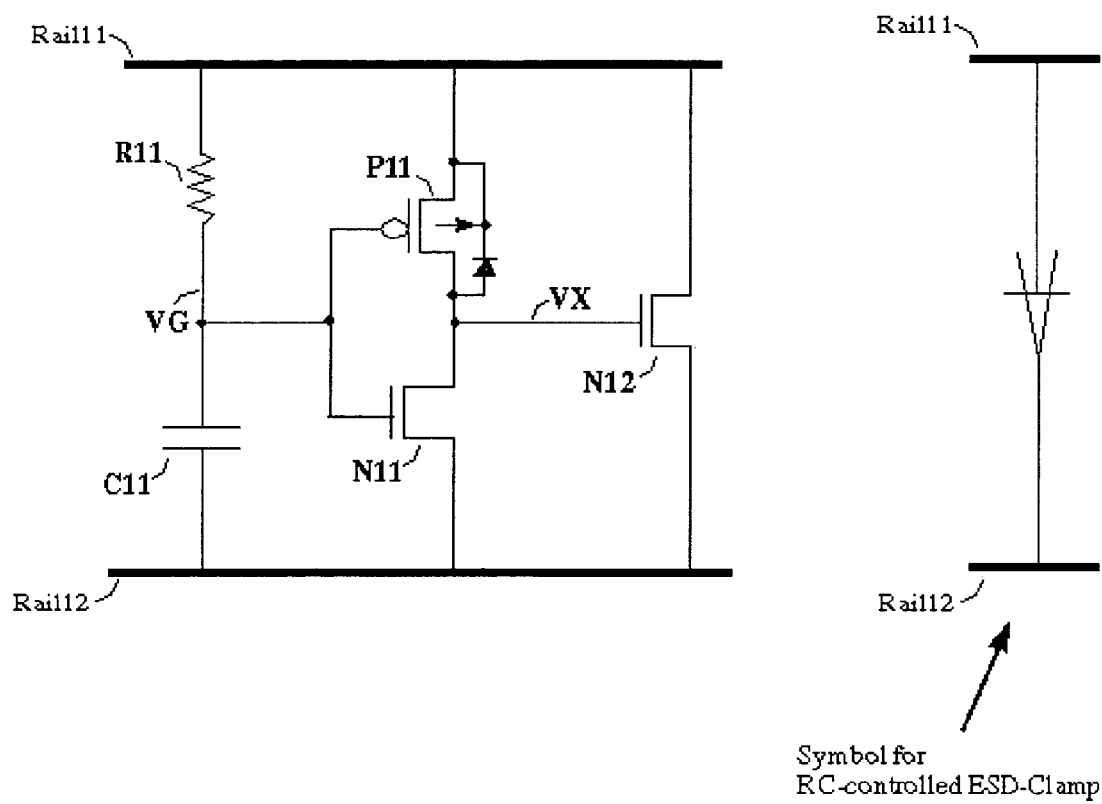
Fig.1: Prior Art

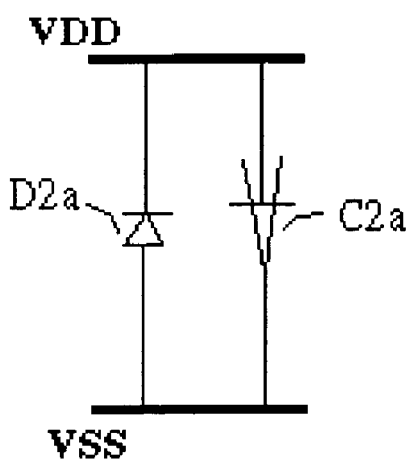
(a)
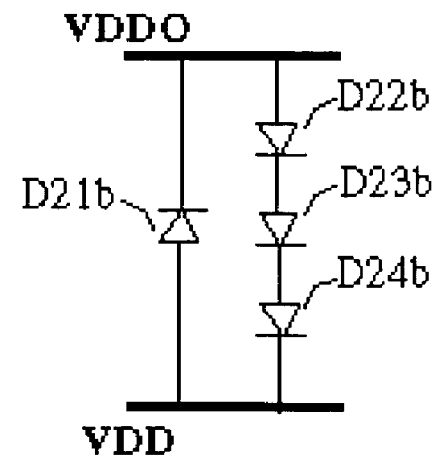
(b)
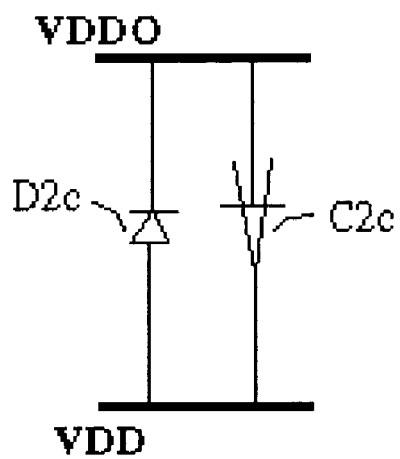
(c)
Fig.2: Prior Art

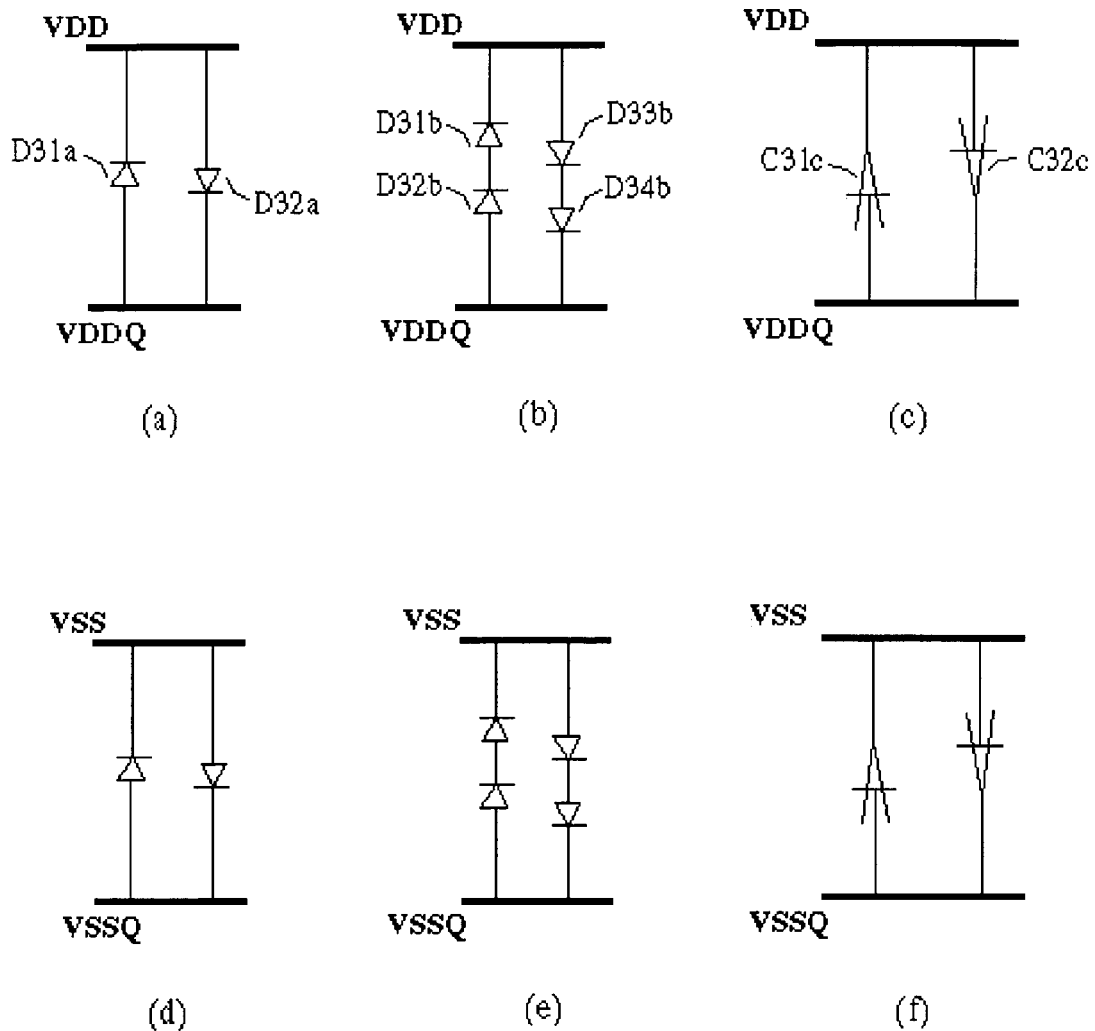
Fig.3: Prior Art

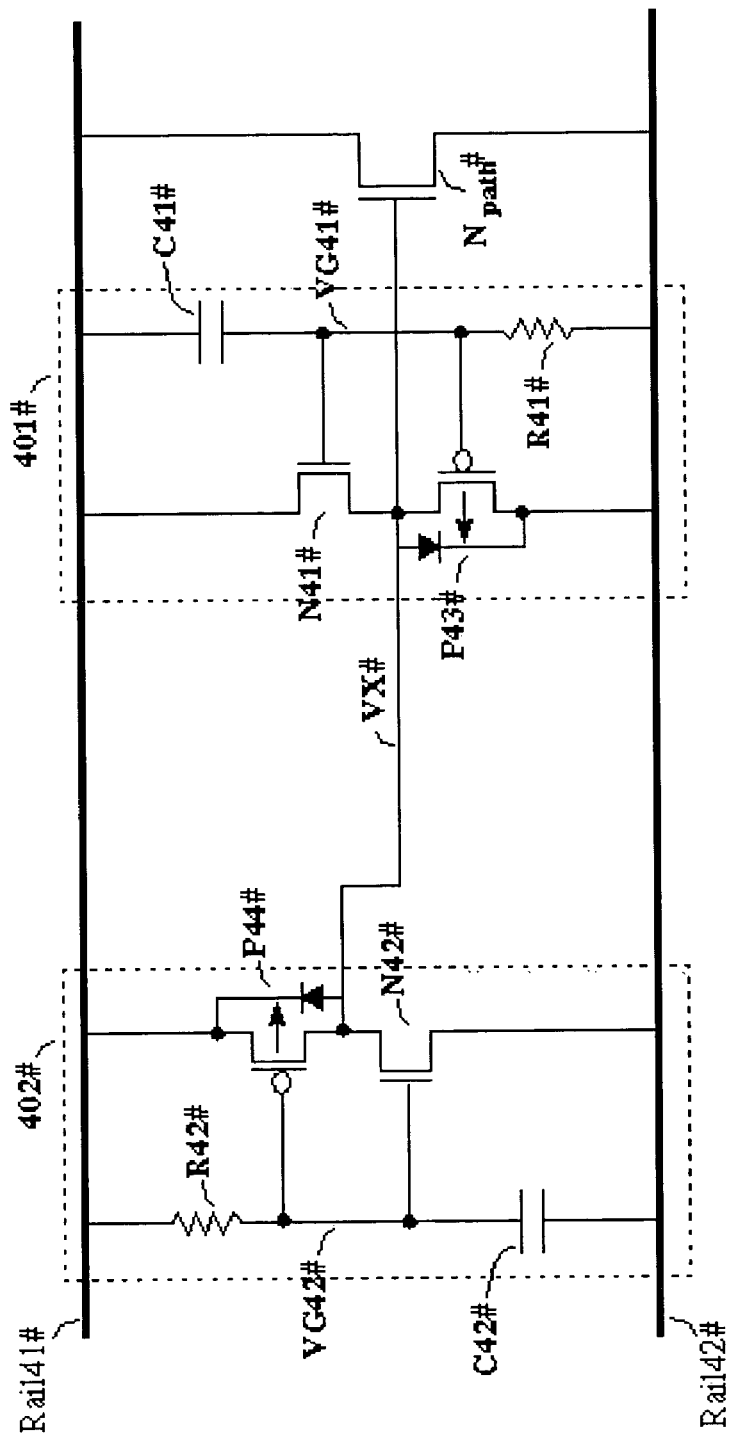
Fig. 4b (For reference only)

SYSTEM AND METHOD FOR A WHOLE-CHIP ELECTROSTATIC DISCHARGE PROTECTION THAT IS INDEPENDENT OF RELATIVE SUPPLY RAIL VOLTAGES AND SUPPLY SEQUENCING

FIELD OF THE INVENTION

This invention relates to Electrostatic Discharge ("ESD") protection arrangements for semiconductor integrated circuits. In particular, the invention relates to systems and methods for whole-chip ESD protection that is independent of relative supply rail voltages and supply sequencing.

BACKGROUND OF THE INVENTION

Electrostatic Discharge ("ESD") is a serious problem for CMOS semiconductor devices since it has the potential to destroy an entire device. Therefore, protection from ESD discharge has become an important issue in CMOS ICs. The advanced processes of sub-micron CMOS technologies greatly degrade the ESD protection strength of CMOS ICs. Circuit designers have concentrated their efforts on developing adequate protection mechanisms.

In general, an IC should be protected for ESD discharge between any pair of pins. A protection circuit should behave as an ideal switch in parallel with the nodes to be protected; such that when an ESD event occurs, it behaves as a shortcircuit while during normal operation of the IC, it remains in a high impedance state.

An existing option is to use an RC-controlled ESD clamp that would sink the ESD current by switching 'on' during the ESD event while remaining 'off' during normal operation. FIG. 1 illustrates an R-C controlled ESD clamp circuit according to the PRIOR ART. The ESD conduction path is provided from Rail11 to Rail12 through NMOS transistor N12. The gate of N12 is controlled by an inverter formed by PMOS transistor P11 and NMOS transistor N11. The inverter itself is driven by ESD-transient detection circuit formed by resistor R11 and capacitor C11.

Initially, the nodes VG and VX are floating because the IC is in the floating condition without power supplies. An ESD event on Rail11 with respect to Rail12 will very slowly charge capacitor C11 and slowly raise the voltage level of node VG. The RC time constant of the RC-circuit R11-C11 is kept higher than the rise time of ESD voltage pulse at Rail11. Thus the voltage level of VG is increased much slower than the voltage level on Rail11. Due to the delay of voltage increase on node VG, PMOS P11 is turned-on by the ESD voltage and conducts ESD voltage into the node VX to turn 'on' the ESD clamping NMOS transistor N12. The turned-on N12 provides a low impedance path between rails Rail11 and Rail12 that discharges the ESD current and clamps the ESD voltage across them.

The turn-on time of ESD-clamp N12 is kept at least equal to half the energy discharging time of the ESD event. The turn-on time of N12 can be adjusted by the RC time constant of the RC-circuit and the relative sizing of P11 and N11. Generally P11 is kept strong and N11 is kept relatively much weaker to ensure a faster response and longer duration turn-on of N12. The symbol used for the clamp is shown in FIG. 1.

IEEE paper "Whole-Chip ESD Protection Design with Efficient VDD-to-VSS ESD Clamp Circuits for Sub micron CMOS VLSI" by Ming-Dou Ker provides a detailed description of such a circuit. This paper also describes a whole chip ESD protection design using such a clamp, in which the clamp is placed between VDD and VSS rails with Rail11 as VDD and Rail12 as VSS.

One limitation to this clamp is that it cannot be used to provide ESD conduction path from rails that are normally at lower voltage to rails that are at higher voltage. This means that in normal operation, Rail11 should always be at voltage higher than or equal to that at Rail12.

This is because if in normal operation we have Rail11 at lower voltage and Rail12 at higher voltage, node VX is pulled-down to the lower voltage through PMOS transistor P11. Thus voltage at node VX will always be one Vtp (PMOS transistor's threshold voltage) higher than the lower voltage, keeping N12 in its sub-threshold region. N12 is large enough to conduct significant amount of static current, even though operating in its sub-threshold region.

U.S. Pat. Nos. 5,946,177, 5,610,791, 6,104,588, 5,953,190 show existing methods of providing ESD conduction paths between VDD and VSS Rails:

FIG. 2(a) shows how an ESD discharge on the VDD rail with respect to VSS is conducted through RC-clamp C2a, while an ESD discharge on VSS rail with respect to VDD is conducted through diode D2a. This scheme is applicable to single supply ICs. As more circuits and functions are integrated into a single chip, a chip often has more than one power supply with different voltage levels. For example, chips have their internal core circuitry operating at one supply voltage level and interfacing I/O circuitry operating at different supply voltage. For such mixed-voltage ICs it becomes important to provide ESD conduction paths between separate supplies to have a robust whole chip ESD protection design.

FIG. 2(b) shows the conventional method to provide ESD conduction path between two separate supply rails. Here I/O supply voltage VDDO is assumed to be at higher supply voltage than core supply VDD. ESD conduction path from VDD rail to VDDO rail is provided through diode D21b and the conduction path from VDDO to VDD through diode chain D22b, D23b, D24b. This scheme requires the IC to be powered-up and powered-down sequentially because of the presence of diode D21b (refer application note "Power-Up Behavior of Pro-ASIC 500K Devices" by ACTEL). Also, diodes in series will degrade the ESD performance and will require larger area for low resistance ESD conduction path. Further, if the voltage difference between VDDO and VDD is large, more than one diode will be required in series. The diode chain will also cause problems during power-up and power-down of the IC. For large differences between VDDO and VDD supplies, an RC-clamp is sometimes used instead of a diode chain, as shown in FIG. 2(c). But this too does not overcome the power sequence requirement.

In some ICs, it is required to have separate isolated power supply and ground rails for different sections of the IC, to avoid noise coupling between 'noisy' and 'quiet' rails. For example power/ground rails of the analog section of an IC are kept isolated from power/ground rails of the digital section to prevent the noisy digital section from affecting the performance of the quiet analog section. Here too it becomes necessary to provide ESD conduction paths between the normally isolated supplies rails.

FIG. 3(a) shows another method to provide an ESD conduction path between two isolated power rails. Here the ESD conduction path between quiet analog section supply voltage VDDQ and noisy digital section supply VDD is provided through diodes D31a and D32a. However these diodes do not provide perfect isolation during normal operations. Any noise greater than the voltage threshold of the diodes will overcome the isolation barrier. Further, this scheme requires both supplies VDDQ and VDD to be powered-up and powered-down simultaneously.

To give a better isolation, a chain of diodes is used instead of a single diode, as shown in FIG. 3(b). However this degrades the ESD performance and requires a larger area for providing a low resistance ESD conduction path. This scheme also requires both supplies VDDQ and VDD to be powered-up and powered-down simultaneously.

A perfect isolation is provided in normal operation by using RC-clamps for ESD conduction, as shown in FIG. 3(c). One such similar scheme is described in U.S. Patent Application No. 2002/0085328 A1. However an RC-clamp uses a large area and therefore using two separate RC-clamps will require excessively large area.

The same problem occurs when this scheme is used for isolated ground rails, as shown in FIGS. 3(d), 3(e), 3(f).

SUMMARY OF THE INVENTION

To address the above-discussed deficiencies of the PRIOR ART, an object of the present invention is to obviate the shortcomings of the PRIOR ART and provide an arrangement that provides an ESD protection that is independent of relative power supply rail voltages.

Another object of the present invention is to provide a bi-directional ESD clamp that consumes minimum area.

Yet another object of the invention is to provide an ESD protection path that is free from power sequencing.

To achieve the said objectives the present invention provides a system for whole-chip ESD protection that is independent of relative supply rail voltages and supply sequencing comprising:

a pair of head-to-head diodes connected across the pair of supply rails with their common cathodes connected to the N-well bulk of the p type devices of the ESD protection arrangement, a first series RC network connected across the supply rails, a first pair of complementary PMOS and NMOS transistors connected in series across the supply terminals and having their drain terminals joined together and their control terminals connected together to the mid point of said first series RC network, a second series RC network connected in anti-parallel across said first series RC network, a second pair of complementary NMOS and PMOS transistors connected in anti-parallel across said first pair of complementary PMOS and NMOS transistors and having their common control terminals connected to the midpoint of said second series RC network while their common drain terminals are joined to the common drain terminals of said first pair of complementary transistors, a pair of PMOS transistors connected in series across the supply rail terminals and having their drain terminals connected together, a first control transistor connected across the capacitor of said first RC network and having its control terminal connected to the drain terminals of said series connected PMOS transistors, a second control transistor connected across the capacitor of said second RC network and having its control terminal connected to the drain terminals of said series connected PMOS transistors, and a clamped transistor connected across the supply terminal having its control terminal connected to the common output terminal of said first and second pair of complementary terminals, the above arrangement being replicated for each pair of supply rails used in the device.

The said pair of rails are powered by similar or different voltages.

The instant invention further provides a method for whole-chip ESD protection that is independent of relative supply rail voltages and supply sequencing comprising the steps of:

connecting a pair of head-to-head diodes across the pair of supply rails with their common cathodes connected to the N-well bulk of the p type devices of the ESD protection arrangement, connecting a first series RC network across the supply rails, joining a first pair of complementary PMOS and NMOS transistors in series across the supply terminals with their drain terminals joined together and their control terminals connected together to the mid point of said first series RC network, attaching a second series RC network in anti-parallel across said first series RC network, connecting a second pair of complementary NMOS and PMOS transistors in anti-parallel across said first pair of complementary PMOS and NMOS transistors with their common control terminals connected to the midpoint of said second series RC network while their common drain terminals are joined to the common drain terminals of said first pair of complementary transistors, connecting a pair of PMOS transistors in series across the supply rail terminals and having their drain terminals joined together, attaching a first control transistor across the capacitor of said first RC network with its control terminal connected to the drain terminals of said series connected PMOS transistors, connecting a second control transistor across the capacitor of said second RC network with its control terminal connected to the drain terminals of said series connected PMOS transistors, connecting a clamped transistor across the supply terminal with its control terminal connected to the common output terminal of said first and second pair of complementary terminals, and replicating the above arrangement for each pair of supply rails used in the device.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The invention will now be described with reference to the accompanying drawings, in which like reference numerals represent like parts, and, in which:

FIG. 1 shows the circuit diagram of the PRIOR ART;

FIGS. 2 and 3 show the PRIOR ART circuits using diode arrays to provide ESD conduction path;

FIG. 4b shows a section of the circuit diagram of FIG. 4a that is a reference circuit to be used for the analysis of the present invention;

FIG. 7 shows a whole chip ESD protection scheme using proposed ESD Clamp of FIG. 4a.

DETAILED DESCRIPTION

FIGS. 1, 2 and 3 have already been explained in the context of the PRIOR ART in the Background to the Invention. FIGS. 4a through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged systems for whole-chip ESD protection.

Figure 4A:
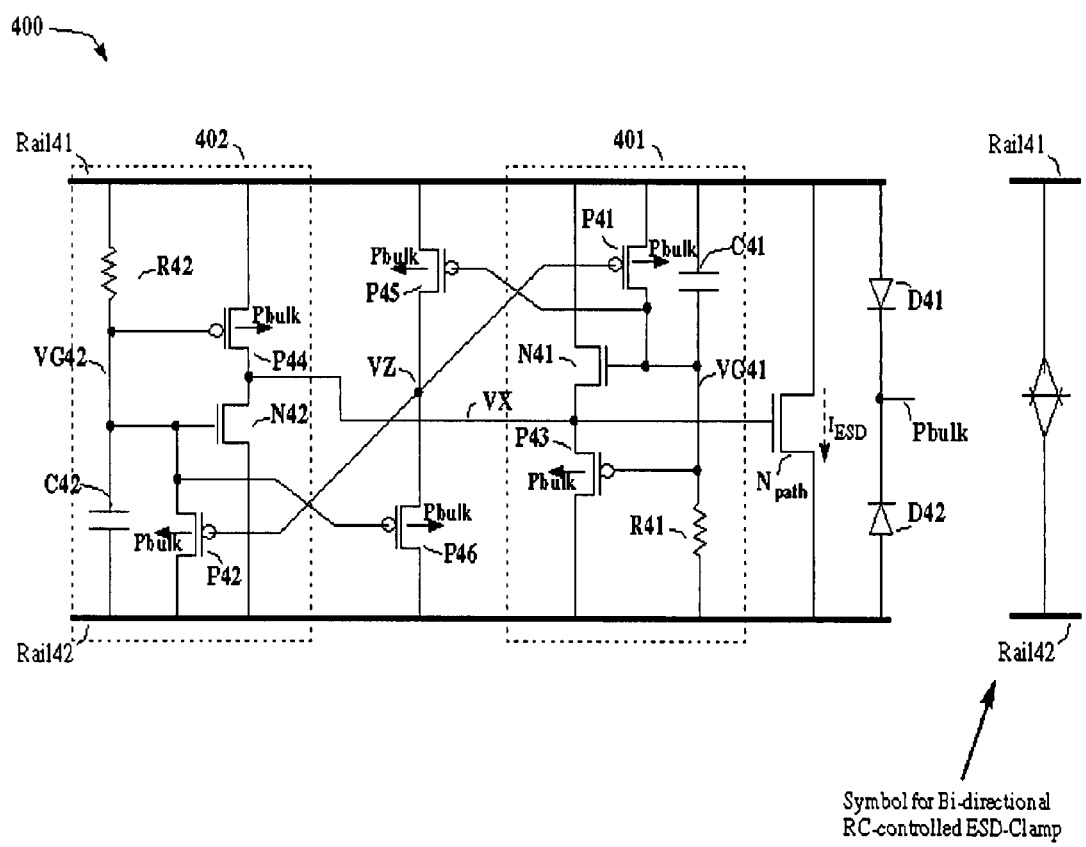
FIG. 4a shows the circuit diagram of the present invention that is a used for whole chip ESD protection arrangement that is independent of relative supply rail voltage and supply sequencing.

FIG. 4a shows the schematic diagram of a bi-directional RC-clamp 400 according to the present invention. The complete circuitry is placed across Rail41 and Rail42, between which the ESD conduction path is required. Starting from the right-hand side, the circuitry includes two head-to-head connected diodes D41 and D42 with their cathodes connected together at node Pbulk. All the PMOS transistors in the circuitry have their N-wells biased with Pbulk. ESD-clamping NMOS transistor $N_{path}$ is connected between Rail41 and Rail42, with its gate connected to node VX. The Gate of $N_{path}$ i.e., net VX is driven by two RC-filter circuits 401 and 402.

In RC-filter circuit 401, a capacitor C41 is connected to Rail41 with its other end connected to a resistor R41, which in turn is connected to Rail42. The common node VG41 of C41 and R41 is connected to the gate inputs of transistors N41 and P43. N41 and P43 are placed in series between the rails with their common node connected at node VX. A PMOS transistor P41 is placed in parallel with capacitor C41 with its gate controlled by node VZ.

It can be seen from FIG. 4a that RC-filter circuit 402 is identical to 401, except that its connectivity to Rail41 and Rail42 is swapped.

Node VZ controls the gates of P41 and P42 of RC-filter circuits 401 and 402 respectively. Node VZ forms the common node of P45 and P46, connected in series between Rail41 and Rail42. The gates of PMOS transistors P45 and P46 are connected to nodes VG41 and VG42 respectively.

To understand the working of circuitry shown in FIG. 4a, we first analyze the circuitry shown in FIG. 4b, which is a subset of the circuitry in FIG. 4a. Here diodes D41, D42 and PMOS transistors P41, P42, P45, P46 are removed.

Referring to FIG. 4b, transistor $N_{path}$# and RC-filter circuit 402# forms a simple unidirectional RC-controlled ESD clamp as shown in PRIOR ART FIG. 1. For an ESD event on Rail41# with respect to Rail42#, 402# will pull the node VX# to a high voltage, causing $N_{path}$# to start conducting.

To make the circuitry bi-directional, i.e. to provide conduction path for ESD current on Rail42# with respect to Rail41#, an identical RC-filter circuit 401# is placed in parallel with 402#, with swapped connectivity to Rail41# and Rail42#. For ESD event on Rail42# with respect to Rail41#, 401# will pull the net VX# to a high voltage, causing $N_{path}$# to start conducting.

However there are two major problems with this circuit: 1) In the case of an ESD event on Rail41# with respect to Rail42#, P44# turns-on, pulling up node VX# to the high ESD voltage. Since the bulk of P43# connected to lower Rail42# voltage, its intrinsic bulk diode will get forward biased. This forward biased bulk diode of P43# will pull down the voltage at net VX#. Lowering of voltage at net VX# will lower the conduction capability of ESD-clamping transistor $N_{path}$#, degrading its ESD performance.

A similar situation will arise when we have an ESD event on Rail42#. In this case the intrinsic bulk diode of P44# will become forward biased.

2) Connecting two parallel RC-filter circuits 402# and 401# in this way will cause them to interfere with each other's performance. An ESD event on Rail41# will couple high voltage on node VG41# through capacitor C41#, causing P43# to turn 'off'. On the other hand a low voltage will exist at node VG42# because of its slower rise, causing P44# to conduct a high voltage into node VX# to turn 'on' the ESD clamping transistor $N_{path}$#. However, as capacitor C42# starts charging and capacitor C41# starts discharging, the conduction capability of P44# decreases while that of P43# increases. This results in a rapid decrease of voltage at node VX# thus reducing the turn-on time of ESD-clamping $N_{path}$#. The RC time constant can be increased to increase the turn-on time of ESD-clamping NMOS $N_{path}$#. However for large RC time constants, very large values of R and C are required, which are difficult to implement practically.

A similar situation will exist for an ESD event on Rail42#. In this case P44# will affect the performance of P43#. It is to be noted that size of devices in 402# are exactly equal to the size of devices in 401# to obtain similar ESD performance of the clamp in both the directions.

Thus, due to the problems discussed above, modifications in the circuitry of FIG. 4b are required such that they do not interfere in the normal operation of the IC. The required modifications are implemented in bi-directional RC-clamp 400 shown in FIG. 4a. (Structural description of circuitry shown in FIG. 4a is already explained earlier.)

Referring to FIG. 4a, diodes D41 and D42 are used to prevent intrinsic bulk diodes of P44 and P43 from getting forward biased. The Nwells of all the PMOS transistors in the circuitry are biased by node Pbulk. Diodes D41 and D42 ensure that node Pbulk always remains at voltage higher of Rail41 and Rail42. In this way Nwells of P44, P43 and other PMOS transistors in the circuitry are always connected to the highest existing voltage in the circuitry and their intrinsic bulk diodes never get forward biased.

To resolve the second problem, two PMOS transistors P42 and P41 are connected in parallel with capacitors C42 and C41 respectively. The Gates of P42 and P41 are controlled by P45 and P46. To understand the operation of the circuitry formed by P41, P42, P45 and P46, we consider the case when there is an ESD potential on Rail41 with respect to Rail42.

The ESD potential on Rail41 will couple a high voltage on node VG41 through capacitor C41, causing P43 and P45 to turn 'off'. On the other hand, a low voltage will exist on node VG42 because of its slower rise, making P44 conduct high voltage into node VX and P46 to conduct low voltage into node VZ. The high voltage on node VX will turn 'on' the ESD clamping NMOS $N_{path}$ and the low voltage on node VZ will turn 'on' P41. (It is to be noted that voltage at node VZ will be one Vtp higher than the voltage at node VG42, where Vtp is threshold voltage of PMOS transistors. But this voltage is low enough to turn-on P41)

The turned-on P41 will pull-up the node voltage at VG41 and as the resistor value of R41 is very high, voltage at node VG41 will become nearly equal to the ESD potential generated at Rail11.

As capacitor C42 starts charging, the voltage at node VG42 will rise, decreasing the conduction capability of P44 and turning-off P46. As P46 turns-off and as P45 is already off, node VZ will become floating and the existing low voltage at node VZ will remain for some period of time. For this period of time P41 will remain 'on', keeping node VG41 at the high ESD voltage. The high voltage on node VG41 will keep P43 perfectly 'off' and therefore the voltage at node VX will not decrease rapidly. As a result, the turn-on time of ESD-clamping $N_{path}$ will become sufficiently long. It is to be noted that the time period for which the low voltage exists at node VZ is long enough to allow sufficient time for ESD discharge. As the circuitry viewed from Rail42 side is exactly symmetrical to that viewed from Rail41 side, the operation of clamp 400 for ESD potential on Rail42 with respect to Rail41 will be similar to that for ESD potential on Rail41 with respect to Rail42. In this case P44 will remain perfectly 'off' and P43 will conduct high voltage into the node VX, turning 'on' ESD clamp NMOS $N_{path}$.

The symbol for the bi-directional clamp is shown along side in FIG. 4a.

Figure 5A:
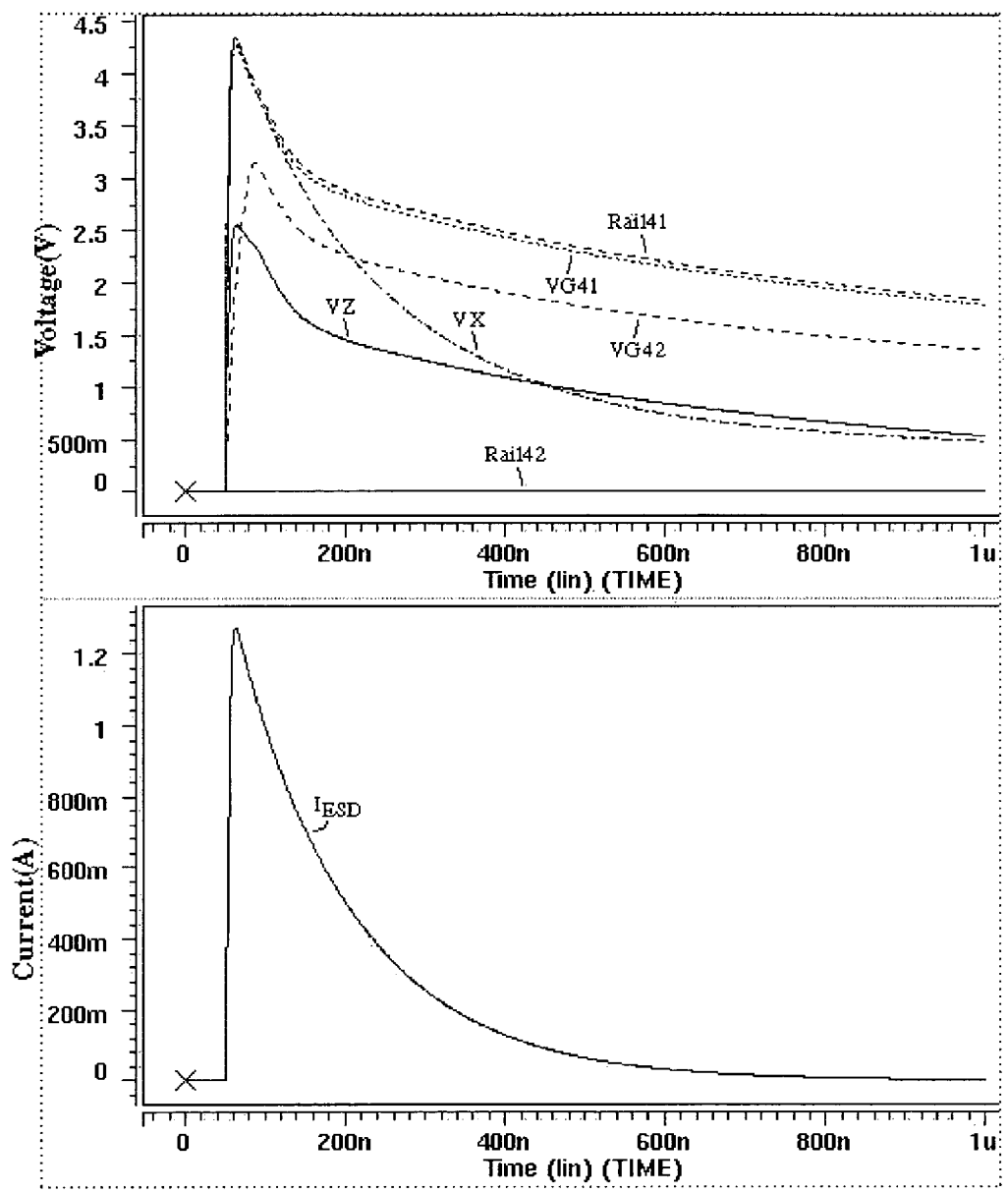
FIGS. 5 and 6 show waveforms for ESD simulations between the two rails.

FIG. 5(a) shows voltage and current waveforms for 2 kV HBM ESD-potential simulations on Rail41 with respect to Rail42.

In the voltage waveforms, it can be seen that voltage on node VZ is low enough to keep P41 'on' and voltage on node VG41 remains close to ESD-potential voltage developed on Rail41.

In current waveform, $I_{ESD}$ is the Source/Drain current through ESD clamping NMOS transistor $N_{path}$.

Figure 5B:
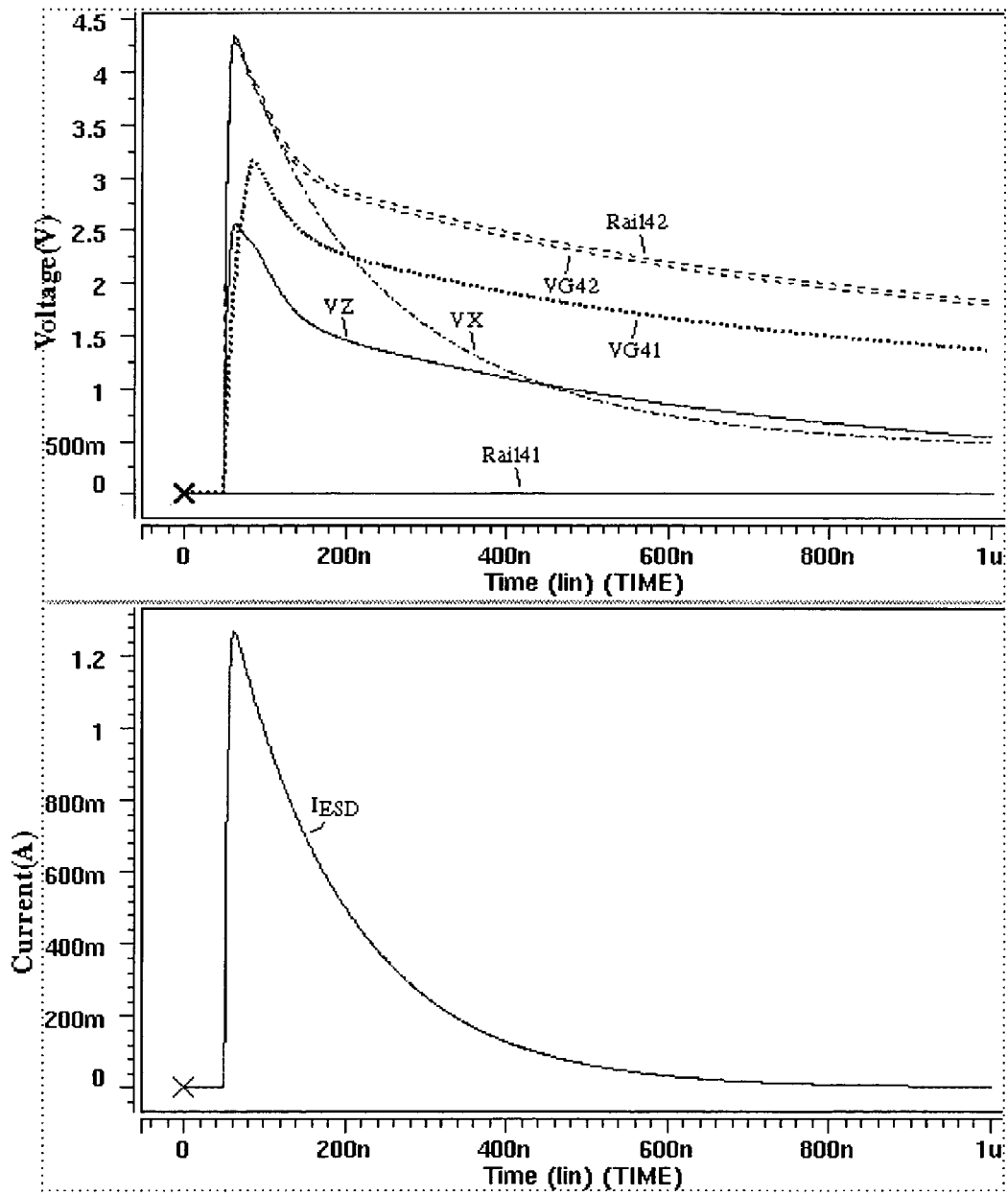

FIG. 5(b) shows voltage and current waveforms for 2 kV HBM ESD-event simulations on Rail42 with respect to Rail41. In this case, it can be seen that the performance of this clamp is similar to that in the earlier case. The voltage on node VZ is low enough to keep P42 'on' and the voltage on node VG42 remains close to ESD-potential voltage developed on Rail42.

In the current waveform, $I_{ESD}$ is the Source/Drain current through ESD clamping $N_{path}$.

The ESD clamp 400 in FIG. 4a can be used to discharge ESD energy between any pair of supply rails. For example between VDD-VDDO, VDDO-VDDQ, VDDQ-VDD, VDD-VSS, VDDQ-VSSQ, etc.

To understand its working in normal power-up condition of IC, consider the following two examples. The first condition arises when it is placed across the VDD-VSS rail and the second when it is placed across the VDD-VDDO rails.

Referring to FIG. 4a, in the first case Rail41 is connected to core supply voltage VDD and Rail42 is connected to ground supply voltage VSS. The VDD power-up voltage waveform has a rise time of the order of milliseconds (ms). With such a slow rise time, the voltage level on the node VG42 in the RC-filter circuit 402 will follow the VDD voltage in time because the RC-time constant of RC circuit R42-C42 is much lower than the power-up rise time. Because the node voltage on VG42 is simultaneously increased to VDD voltage level in the VDD power-up condition, P44 and P46 remain 'off' and N42 is turned 'on' to keep node VX at a ground voltage level VSS.

In RC-filter circuit 401, node VG41 will remain at ground level, keeping N41 'off' and P43 and P45 'on'. This will keep node VX at a ground voltage level and P45 will pull node VZ to high VDD voltage. This high voltage on node VZ will ensure that P42 and P41 remain 'off'.

As node VX remains at ground voltage level, the ESD clamping NMOS transistor $N_{path}$ is guaranteed to remain 'off' while the IC is under the VDD power-on condition or in normal operating condition.

Because of the bi-directional and symmetrical nature of the circuitry, the supply connections can be interchanged, i.e. Rail41 can be connected to VSS and Rail42 can be connected to VDD. Therefore there is no limitation of connecting Rail41 always at higher voltage and Rail42 always at lower voltage in normal operation, as we had in conventional clamps shown in FIG. 1.

Due to the difference in the rise times between the ESD voltage and the VDD power-up voltage, the VDD-to-VSS ESD clamp circuit provides a low-impedance path between the VDD and VSS power lines in ESD stress conditions, but becomes an open circuit between the power lines in the VDD power-up conditions.

Figure 6:
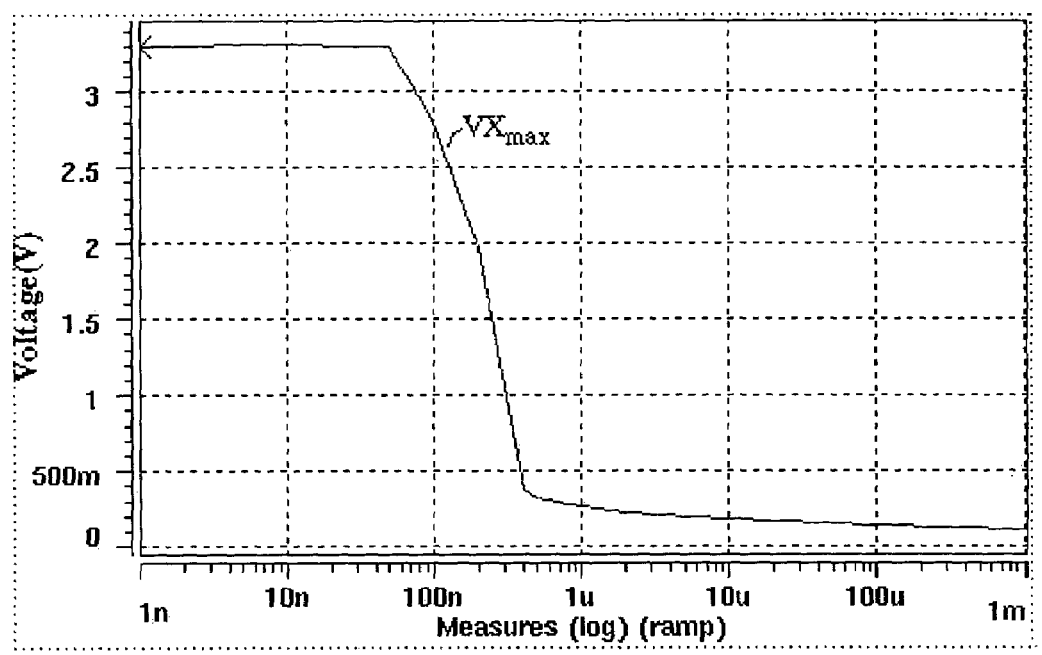

FIG. 6 shows the curve for maximum voltage appearing on node VX for varying rise times of 0-3.3V voltage ramp. A voltage ramp is applied on Rail41 with respect to Rail42. It can be seen from the graph that for ramp rise times of 100 ns or less, the voltage on node VX is large enough to turn-on ESD clamping NMOS transistor $N_{path}$ and for ramp rise time of 1 us or more, the voltage on node VX is small enough to keep ESD clamping NMOS transistor $N_{path}$ 'off'.

In the second case, Rail41 is connected to the higher 3.3V I/O voltage VDDO and Rail42 is connected to the lower 1.8V core voltage VDD. Connecting bi-directional clamp 400 between separate power supply rails like VDD and VDDO, does not require any power-up sequence to be followed.

When 3.3 V VDDO supply at Rail41 is powered-up first, node VG42 will follow VDDO supply rise, turning-on N42 and pulling down node VX to the lower VDD voltage, which is still not powered-up. Now, when the 1.8V VDD supply at Rail42 is powered-up, the VDD voltage will be conducted to node VX through N42. Even when VX is pulled to 1.8V, ESD clamping NMOS transistor $N_{path}$ remains 'off', as its source is connected to the same voltage.

When the 1.8 V VDD supply is powered-up first, the node voltage at VG41 will follow the VDD supply in time, turning-on N41 and pulling down node VX to the lower VDDO voltage, which is still not powered-up. Now, when the 3.3V VDDO supply is powered-up, it will be conducted to node VX through N41, until it reaches 1.8V. When the VDDO voltage rises above 1.8V, N41 will turn-off and as node VG42 will increase simultaneously with VDDO, N42 will turn-on. Now N42 will conduct lower 1.8V VDD supply to node VX keeping $N_{path}$ 'off'.

So, it is seen that for any power-up sequence, node VX always remains at the lower of two power supplies. So for any sequence followed to power-up VDD and VDDO, the ESD clamping $N_{path}$ is guaranteed to remain 'off'.

Here again, because of the bi-directional and symmetrical nature of the circuitry, the supply connections can be interchanged.

It will apparent to those skilled in this field that in the conventional RC-controlled clamps as shown in FIG. 1, 70% to 80% of the total clamp layout area is taken by ESD-clamping NMOS transistor N12 and only 20% to 30% by RC-filter circuitry. As, in bi-directional RC-controlled clamp according to present invention shown in FIG. 4a, an extra RC-filter circuit in added, this clamp will require only 20% to 30% more area compared to conventional clamp. The four extra PMOS transistors added in bi-directional RC-controlled clamp are of small sizes and therefore take negligible area compared to total area of the clamp.

But when the area of the proposed bi-directional clamp is compared with the combined area taken by conventional ESD protection devices placed between two rails, it is much smaller. For example to provide ESD conduction paths between VDD and VSS rails, conventionally a diode and a unidirectional clamp are used as shown in FIG. 2(a), which can be replaced by a single proposed bi-directional clamp. The area taken by bi-directional clamp will be less than the combined area taken by diode and a unidirectional clamp.

Figure 7:
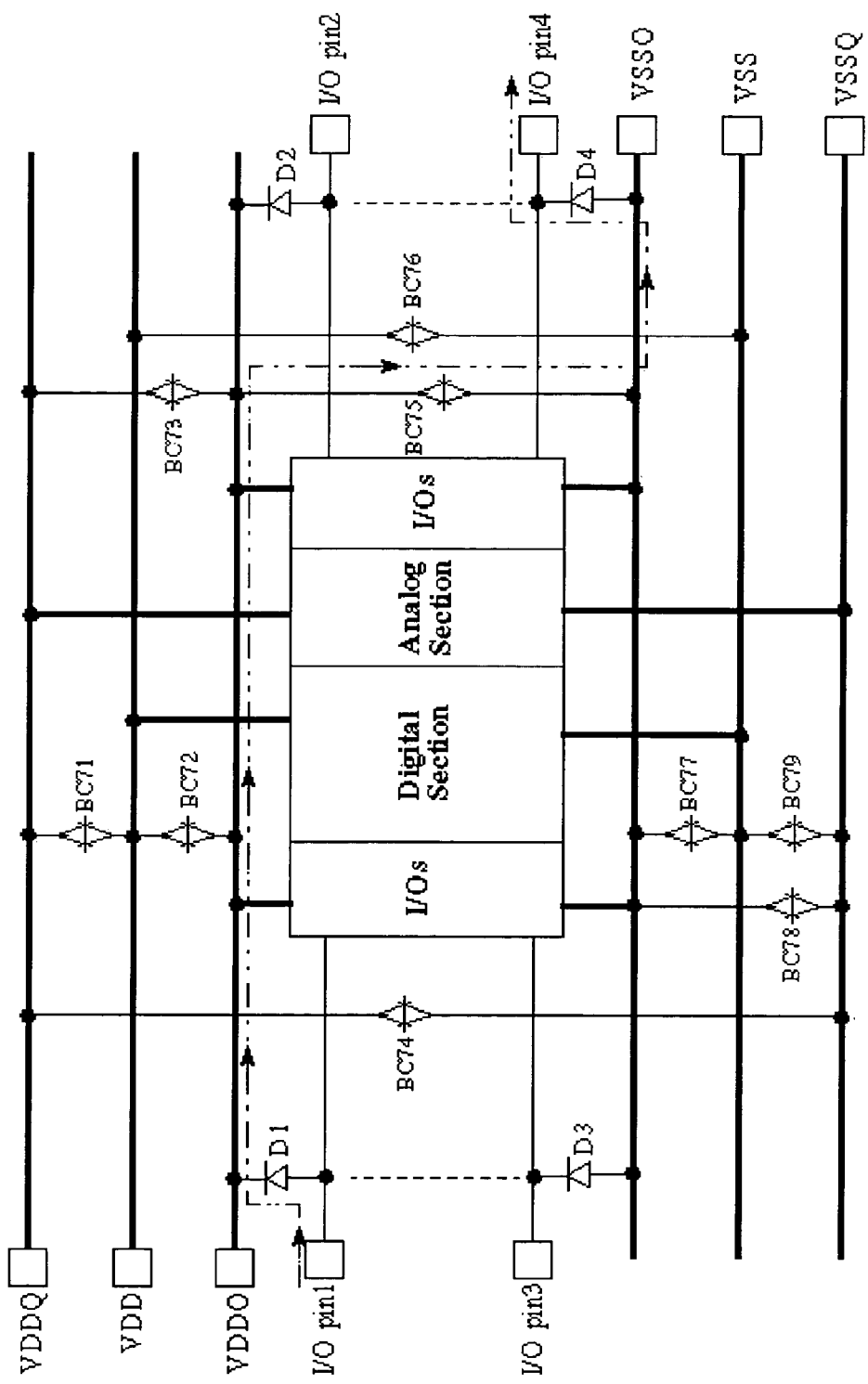

FIG. 7 shows a whole chip ESD protection scheme using proposed bi-directional RC-controlled clamps. The example here is of a mixed voltage IC, having three separate supply pairs including, I/O supply pair VDDO-VSSO for I/O circuitry, noisy supply pair VDD-VSS for the digital section and quiet supply pair VDDQ-VSSQ for the analog section.

Bi-directional clamps are placed between every separate supply pair, between every pair of power rails and between every pair of ground rails. Each I/O pin is connected to the corresponding ground and power rails through diode, which remain reverse biased during normal operation.

An ESD event on I/O pin1 will be conducted to VDDO rail through diode D1, from VDDO rail to VSSO rail through bi-directional clamp BC75 and finally from VSSO rail to I/O pin4 through diode D4. ESD energy discharge path is shown by dotted lines in FIG. 7.

The scheme shown in FIG. 7 is very general and simple modifications can be made to it if desired. For example if perfect isolation between ground rails is not required, then bi-directional clamps BC77, BC78 and BC79 can be replaced by diodes. It is intended that the present invention encompass such changes and modifications as fall within the scope of the appended claims.

What is claimed is:

1. A system for electrostatic discharge (ESD) protection of a semiconductor integrated circuit having first and second supply voltage rails, the system comprising:
   a clamp transistor coupled to the first and second supply voltage rails; and
   first and second ESD-sensing circuits, wherein each ESD-sensing circuit, responsive to an ESD potential on a first power terminal with respect to a second power terminal, is operable to turn on the clamp transistor to create a low-impedance path between the first and second supply voltage rails, wherein:
      the first and second power terminals of the first ESD-sensing circuit are electrically connected, respectively, to the first and second supply voltage rails,
      the first and second power terminals of the second ESD-sensing circuit are electrically connected, respectively, to the first and second supply voltage rails,
      the first ESD-sensing circuit, responsive to an ESD potential on its first power terminal with respect to its second power terminal, is capable of improving an 'on-time' of the clamping transistor by inhibiting the second ESD-sensing circuit, and
      the second ESD-sensing circuit, responsive to an ESD potential on its second power terminal with respect to its first power terminal, is capable of improving the "on-time' of the clamping transistor by inhibiting the first ESD-sensing circuit.

2. The system of claim 1, wherein the first ESD-sensing circuit comprises a resistor and a capacitor coupled in series between the first and second power terminals and a first inhibit PMOS transistor coupled in parallel across the capacitor, and the second ESD-sensing circuit comprises a resistor and a capacitor coupled in series between the first and second power terminals and a second inhibit PMOS transistor coupled in parallel across the capacitor, wherein one of the first and second ESD sensing circuits is capable of increasing on-time of clamping transistor by inhibiting the other of the first and second ESD sensing circuits from turning off the clamp transistor.

3. The system of claim 2, wherein:
   a first inhibit control PMOS transistor and a second inhibit control PMOS transistor are coupled in series between the first and second supply voltage rails, a drain of the first inhibit control PMOS transistor coupled to a drain of the second inhibit control PMOS transistor, a gate terminal of the first inhibit control PMOS transistor coupled to a common terminal of the series resistor and capacitor of the first ESD-sensing circuit, and a gate terminal of the second inhibit control PMOS transistor coupled to a common terminal of the series resistor and capacitor of the first ESD-sensing circuit and a gate terminal of the second inhibit control PMOS transistor coupled to a common terminal of the series resistor and capacitor of the second ESD-sensing circuit,
   one of the first and second inhibit control PMOS transistors is activated by one of the ESD-sensing circuits, and
   one of the first and second inhibit control PMOS transistors turns on inhibit PMOS of the other ESD-sensing circuit that inhibits the ESD-sensing circuit from turning off the ESD clamp transistor.

4. The system of claim 3, wherein:
   each of the first and the second ESD-sensing circuits further comprises complementary clamp control PMOS and NMOS transistor coupled in series between the first and second power rails, having their drain terminals coupled together and their gate terminals coupled to the common terminal of the series resistor and the capacitor, and
   in one of the first and second ESD-sensing circuits, the voltage at the common terminal of the series resistor and the capacitor operates to activate the clamp control PMOS transistor to turn-on the clamp transistor, and operates to turn on the inhibit control PMOS of the ESD-sensing circuit to improve the "on-time" of the ESD clamp transistor.

5. The system of claim 4, wherein:
   a first diode having its anode coupled to the first supply voltage rail and its cathode coupled to an N-wells of the PMOS transistors,
   a second diode having its anode coupled to the second supply voltage rail and its cathode coupled to an N-wells of the PMOS transistors, and
   the N-wells of the PMOS transistors of the first and the second ESD sensing circuits and the inhibit control PMOS transistors are biased at a higher voltage of the first and second supply voltage rails.

6. The system of claim 5, wherein in one of the first and second ESD-sensing circuits, as the voltage on its first power terminal rises above the voltage on its second power terminal with a rise time less than the time constant of the ESD-sensing circuit, the clamp control NMOS transistor operates to maintain the clamp transistor in an off state.

7. A method of protecting from electrostatic discharge (ESD) in a semiconductor integrated circuit comprising first and second supply voltage rails, first and second ESD-sensing circuits and a clamp transistor coupled to the first and second supply voltage rails, the method comprising:

in the first ESD-sensing circuit, responsive to an ESD potential on the first supply voltage rail with respect to the second supply voltage rail, turning on the clamp transistor to provide a low impedance path between the first and second supply voltage rails, wherein one of the first and second ESD sensing circuits improves an 'on' time of the ESD clamping transistor by inhibiting the second ESD-sensing circuit from turning off the clamp transistor; and in the second ESD-sensing circuit, responsive to an ESD potential on the second supply voltage rail with respect to the first supply voltage rail, turning on the clamp transistor to provide a low impedance path between the first and second supply voltage rails, wherein the other of the first and second ESD sensing circuits improves the 'on' time of the ESD clamping transistor by inhibiting the first ESD-sensing circuit from turning off the clamp transistor.

8. The method of claim 7, wherein the first and second ESD-sensing circuits each comprise a PMOS transistor, the method further comprising:

biasing N-wells of the PMOS transistors at a higher voltage of the first and second supply voltage rails.

9. The method of claim 7, further comprising:

maintaining the clamp transistor in an off state, responsive to the voltage on one of the first and second supply voltage rails rising above the other one of the first and second supply voltage rails with a rise time less than a predetermined time constant.

10. The method of claim 9, wherein each of the first and second ESD-sensing circuits comprises a resistor and capacitor coupled in series between the first and second supply voltage rails and an inhibit PMOS transistor coupled in parallel across the capacitor, the method further comprising:

the step of inhibiting the first ESD-sensing circuit from turning off the clamp transistor comprises turning on the inhibit PMOS transistor of the first ESD-sensing circuit to provide a low-impedance current path around the capacitor of the first ESD-sensing circuit, and the step of inhibiting the second ESD-sensing circuit from turning off the clamp transistor comprises turning on the inhibit PMOS transistor of the second ESD-sensing circuit to provide a low-impedance current path around the capacitor of the second ESD-sensing circuit.

11. The method of claim 10, wherein:

the first and second ESD-sensing circuits are capable of inhibiting the other one of the first and second ESD-sensing circuits by turning on the inhibit PMOS transistor in the other one of the first and second ESD-sensing circuits to provide a low impedance current path around the capacitor in the other one of the first and second ESD-sensing circuits.

12. The method of claim 11, wherein the step of maintaining the clamp transistor in an off state, responsive to the voltage on one of the first and second supply voltage rails rising above the other supply voltage rail with a rise time less than a predetermined time constant, further comprises:

in one of the first and second ESD-sensing circuits, turning on the clamp control NMOS transistor of the ESD-sensing circuit to maintain the clamp transistor in an off state.

13. The method of claim 12, wherein the semiconductor integrated circuit further comprises first and second inhibit control PMOS transistors coupled to the gate terminals of the inhibit PMOS transistors of the second and first ESD-sensing circuits, respectively, wherein:

the step of turning on the second inhibit PMOS transistor comprises turning on the first inhibit control PMOS transistor, responsive to an ESD potential on the first supply voltage rail with respect to the second supply voltage rail, and the step of turning on the first inhibit PMOS transistor further comprises turning on the second inhibit control PMOS transistor, responsive to an ESD potential on the second supply voltage rail with respect to the first supply voltage rail.

14. A semiconductor integrated circuit comprising:

first and second supply voltage rails; and an electrostatic discharge (ESD) protection circuit, comprising a clamp transistor coupled to the first and second supply voltage rails; and first and second ESD-sensing circuits, each ESD-sensing circuit, responsive to an ESD potential on a first power terminal with respect to a second power terminal, being operable to turn on the clamp transistor to create a low-impedance pat between the first and second supply voltage rails, wherein:

the first and second power terminals of the first ESD-sensing circuit are electrically connected, respectively, to the first and second supply voltage rails, the first and second power terminals of the second ESD-sensing circuit are electrically connected, respectively, to the second and first supply voltage rails, and one of the first and second ESD-sensing circuits, responsive to an ESD potential on its first power terminal with respect to its second power terminal, is capable of improving an 'on-time' of the ESD clamping transistor by inhibiting the other one of the first and second ESD-sensing circuits from turning off the clamp transistor.

15. The semiconductor integrated circuit of claim 14, wherein each of the first and second ESD-sensing circuits comprises an inhibit PMOS transistor, the ESD protection circuit further comprising:

a first diode having its anode coupled to the first supply voltage rail and its cathode coupled to N-wells of the PMOS transistors; and a second diode having its anode coupled to the second supply voltage rail and its cathode coupled to the N-wells of the PMOS transistors, wherein the N-wells of the PMOS transistors are biased at a higher voltage of the first and second supply voltage rails.

16. The semiconductor integrated circuit of claim 15, wherein:

each of the first and second ESD-sensing circuits has a characteristic time constant, and one of the first and second ESD-sensing circuits, responsive to the voltage on its first power terminal rising above the voltage on its second tower terminal with a rise time less than the time constant of the ESD-sensing circuit, maintains the clamp transistor in an off state.

17. The semiconductor integrated circuit of claim 16, wherein:

each of the first and second ESD-sensing circuits comprises a resistor and capacitor coupled in series between the first and second power terminals and the inhibit PMOS transistor coupled in parallel across the capacitor, and one of the first and second ESD-sensing circuits is capable of inhibiting the other one of the first and second ESD-sensing circuits by turning on the inhibit PMOS transistor in the other one of the first and second ESD-sensing circuits to provide a low-impedance current path around the capacitor in the other one of the first and second ESD-sensing circuits.

18. The semiconductor integrated circuit of claim 17, wherein:
   each of the first and second ESD-sensing circuits further comprises complementary clamp control PMOS and NMOS transistors coupled in series between the first and second power rails, having their drain terminals coupled together and their gate terminals coupled to common terminals of the series resistor and capacitor, and
   in one of the first and second ESD-sensing circuits, the voltage at the common terminal of the series resistor and capacitor operates to inhibit the other one of the first and second ESD-sensing circuits from turning off the clamp transistor.

19. The semiconductor integrated circuit of claim 18, wherein in one of the first and second ESD-sensing circuits, as the voltage on its first power terminal rises above the voltage on its second power terminal with a rise time less than the time constant of the ESD-sensing circuit, the clamp control NMOS transistor operates to maintain the clamp transistor in an off state.

20. The semiconductor integrated circuit of claim 19, wherein:
   the ESD protection circuit further comprises first and second inhibit control PMOS transistors coupled in series between the first and second supply voltage rails, having their drain terminals coupled together and also coupled to the gate terminals of the inhibit PMOS transistors of the first and second ESD-sensing circuits,
   the gate terminal of the first inhibit control PMOS transistor is coupled to the common terminal of the series resistor and capacitor of the first ESD-sensing circuit and the first inhibit control PMOS transistor is operable to turn on the inhibit PMOS transistor in the second ESD-sensing circuit, and
   the gate terminal of the second inhibit control PMOS transistor is coupled to the common terminal of the series resistor and capacitor of the second ESD-sensing circuit and the second inhibit control PMOS transistor is operable to turn on the inhibit PMOS transistor in the first ESD-sensing circuit.

\* \* \* \* \*

UNITED STATES PATENT AND TRADEMARK OFFICE
CERTIFICATE OF CORRECTION

PATENT NO. : 7,394,638 B2
APPLICATION NO. : 11/022306
DATED : July 1, 2008
INVENTOR(S) : Adeel Ahmad and Rajat Chauhan It is certified that error appears in the above-identified patent and that said Letters Patent is hereby corrected as shown below:

Column 10, claim 3, line 21, delete "first" and replace with --second--;

Column 10, claim 3, lines 21-24, delete "and a gate terminal of the second inhibit control PMOS transistor coupled to a common terminal of the series resistor and capacitor of the second ESD sensing circuit";

Column 12, claim 14, line 19, delete "pat" and replace with --path--;

Column 12, claim 16, line 54, delete "tower" and replace with --power--; and

Column 14, claim 20, line 13, delete "torn" and replace with --turn--.

Signed and Sealed this

Sixth Day of October, 2009

David J. Kappos
*Director of the United States Patent and Trademark Office*